United States Patent
Tye et al.

(10) Patent No.: US 9,583,309 B1
(45) Date of Patent: Feb. 28, 2017

(54) SELECTIVE AREA IMPLANT OF A WORKPIECE

(71) Applicant: Varian Semiconductor Equipment Associates, Inc., Gloucester, MA (US)

(72) Inventors: Jordan B. Tye, Arlington, MA (US); Mark R. Amato, South Hamilton, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 14/972,602

(22) Filed: Dec. 17, 2015

(51) Int. Cl.
| | | |
|---|---|---|
| *H01J 37/317* | (2006.01) | |
| *H01L 21/265* | (2006.01) | |
| *H01L 21/683* | (2006.01) | |

(52) U.S. Cl.
CPC .... *H01J 37/3171* (2013.01); *H01L 21/26506* (2013.01); *H01L 21/6831* (2013.01); *H01J 2237/31703* (2013.01)

(58) Field of Classification Search
USPC .......... 250/492.21, 398, 440.11, 442.11
See application file for complete search history.

(56) References Cited

U.S. PATENT DOCUMENTS

| | | | | |
|---|---|---|---|---|
| 2008/0124903 A1* | 5/2008 | England | .............. | H01J 37/3171 438/530 |
| 2010/0308236 A1* | 12/2010 | Carlson | .............. | H01J 37/3171 250/492.3 |
| 2016/0298229 A1* | 10/2016 | Evans | .................. | C23C 14/221 |

OTHER PUBLICATIONS

Morgan D. Evans, Selective Processing of a Workpiece, U.S. Appl. No. 14/681,762, filed Apr. 8, 2015.

\* cited by examiner

*Primary Examiner* — Kiet T Nguyen

(57) ABSTRACT

Apparatus and methods for the selective implanting of the outer portion of a workpiece are disclosed. A mask is disposed between the ion beam and the workpiece, having an aperture through which the ion beam passes. The aperture may have a concave first edge, forming using a radius equal to the inner radius of the outer portion of the workpiece. Further, the mask is affixed to a roplat such that the platen is free to rotate between a load/unload position and an operational position without moving the mask. In certain embodiments, the mask is affixed to the base of the roplat and has a first portion with an aperture that extends vertically upward from the base, and a second portion that is shaped so as not to interfere with the rotation of the platen. In other embodiments, the mask may be affixed to the arms of the roplat.

19 Claims, 7 Drawing Sheets

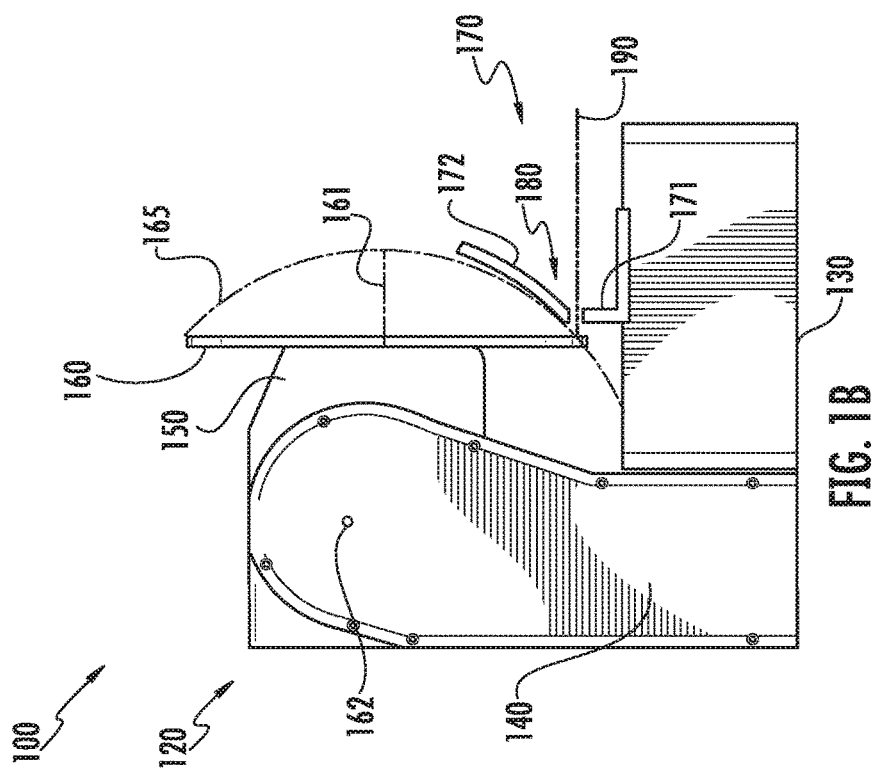
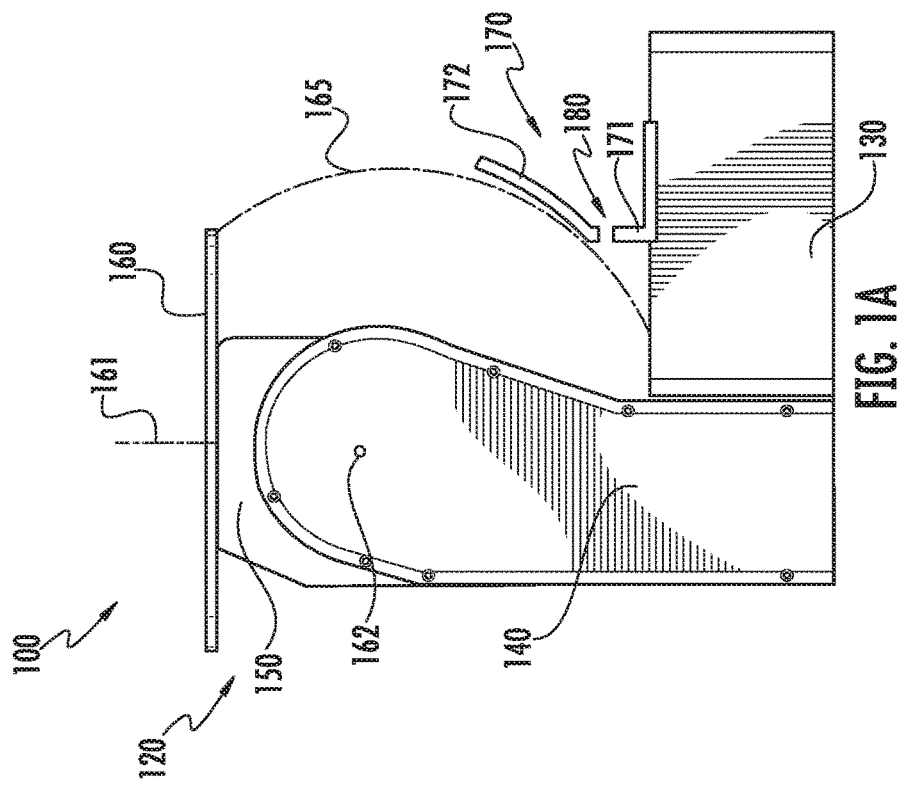

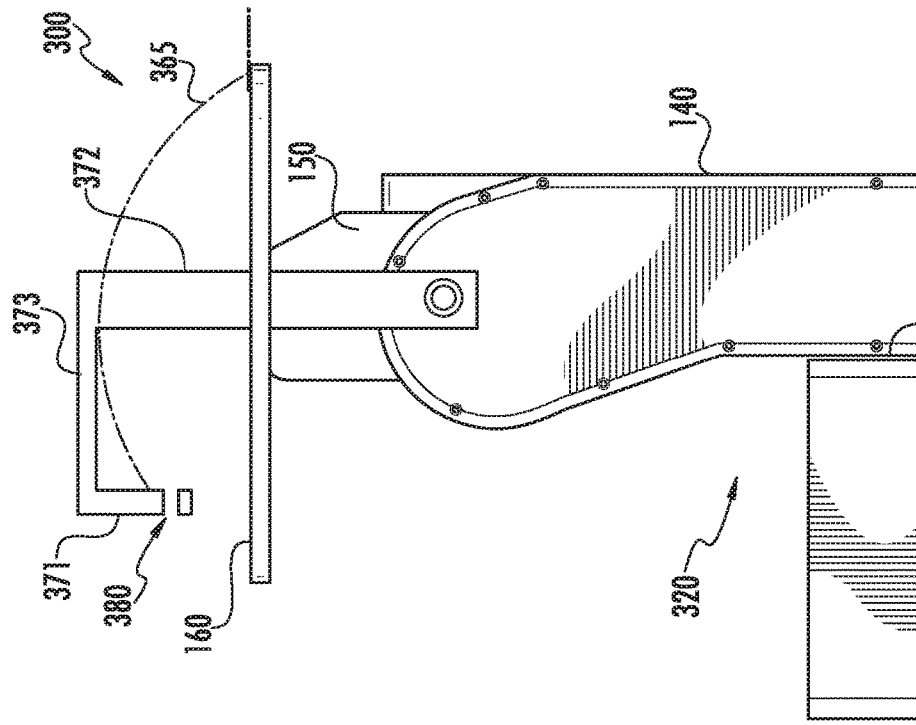
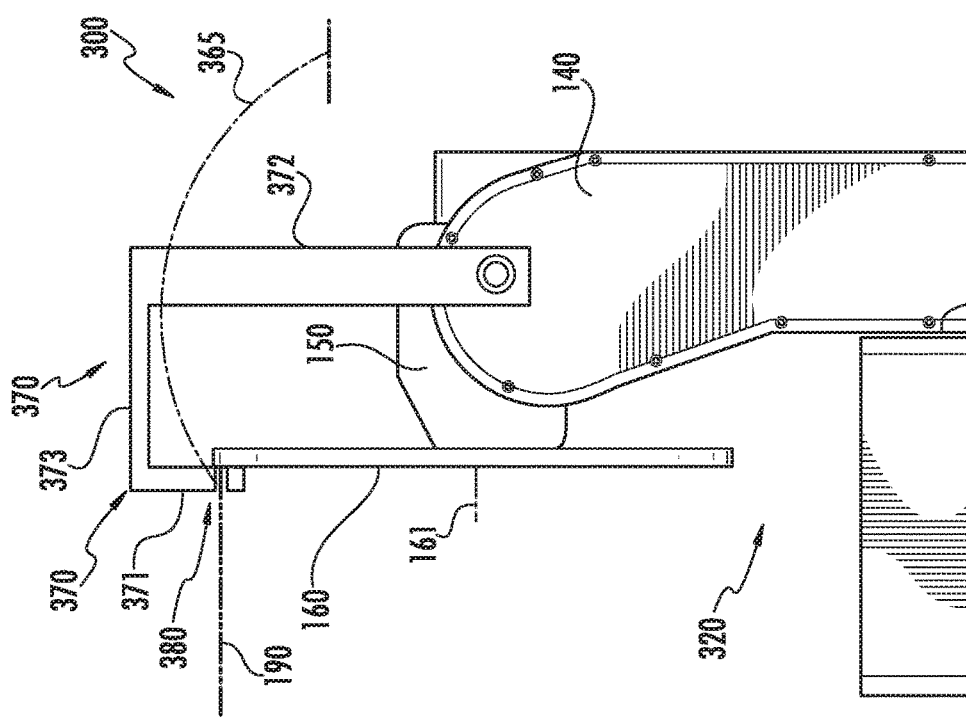

SELECTIVE AREA IMPLANT OF A WORKPIECE

Embodiments of the present disclosure relate to an apparatus and method for selectively processing a workpiece, and more particularly, for selectively implanting an outer portion of a semiconductor workpiece.

BACKGROUND

As demands for greater workpiece utilization continue to rise, one possible area that may be improved is the processing of the outer portion of the workpiece. Often, the outer portion of the workpiece is not implanted or processed to the same extent as the rest of the workpiece. For example, spin coating processes may leave a greater thickness of material near the outer edge due to centripetal force. Implant processes may provide a different dose near the edge of the workpiece since the outer edge may be at a slightly different temperature than the rest of the workpiece. Other non-uniformities also exist in the semiconductor fabrication process. These non-uniformities negatively impact the utilization of the workpiece, as the area near the outer edge of the workpiece may ultimately be wasted.

Efforts have been made to improve the uniformity of these various semiconductor processes. However, there may be limits to the degree of uniformity that may be achieved by these processes.

Therefore, it would be beneficial if there were an apparatus and method for selectively implanting the outer portion of a workpiece. Further, it would be advantageous if this selective implant improved the overall process uniformity of the workpiece without negatively impacting the throughput of the semiconductor fabrication process.

SUMMARY

Apparatus and methods for the selective implanting of the outer portion of a workpiece are disclosed. A mask is disposed between the ion beam and the workpiece, the mask having an aperture through which the ion beam passes. The aperture may have a concave first edge, formed using a radius equal to the inner radius of the outer portion of the workpiece. Further, the mask is affixed to a roplat such that the platen is free to rotate between a load/unload position and an operational position without moving the mask. In certain embodiments, the mask is affixed to the base of the roplat and has a first portion with an aperture that extends vertically upward from the base, and a second portion that is shaped so as not to interfere with the rotation of the platen. In other embodiments, the mask may be affixed to the arms of the roplat.

According to one embodiment, an apparatus for processing an outer portion of a workpiece is disclosed. The apparatus comprises a roplat comprising: a base; arms extending upward from the base; and a rotatable assembly disposed between the arms, wherein the rotatable assembly rotates about an axis between a load/unload position and an operational position; a platen disposed on the rotatable assembly configured to rotate about its center; and a mask affixed to the roplat, the mask having an aperture through which an ion beam passes, wherein the mask is shaped such that the mask does not interfere with the platen as the rotatable assembly is rotated between the load/unload position and the operational position. In certain embodiments, the aperture has a concave first edge, wherein the concave first edge is formed using a radius equal to an inner radius of the outer portion of the workpiece. In certain embodiments, the mask is affixed to the base and blocks a bottom portion of the platen from an ion beam when the rotatable assembly is in the operational position. In this embodiment, the mask may comprise a first portion comprising the aperture and a second portion, wherein the second portion is shaped so as not to interfere with movement of the platen. The first portion may extend vertically upward from the base. The second portion may be curved outward such that a horizontal distance between the mask and the platen increases as the vertical distance from the base increases. In certain embodiments, the second portion comprises one or more slanted segments configured such that a horizontal distance between the mask and the platen increases as the vertical distance from the base increases. In certain embodiments, the second portion comprises one or more horizontal segments and one or more vertical segments, configured such that a horizontal distance between the mask and the platen increases stepwise as the vertical distance from the base increases. In certain embodiments, the mask is affixed to the arms and blocks a top portion of the platen from an ion beam when the rotatable assembly is in the operational position. In this embodiment, the mask may comprise extenders extending upward from the arms; cross members extending perpendicularly from the extenders; and a first portion extending downward from the cross members so as to block a top portion of the platen from the ion beam when the rotatable assembly is in the operational position.

According to a second embodiment, an apparatus for processing an outer portion of a workpiece is disclosed. The apparatus comprises a roplat comprising: a base; arms extending upward from the base; and a rotatable assembly disposed between the arms, wherein the rotatable assembly rotates about an axis between a load/unload position and an operational position; a platen disposed on the rotatable assembly configured to rotate about its center; and a mask affixed to the roplat, and extending so as to block a portion of the platen from an ion beam when the rotatable assembly is in the operational position, wherein the mask comprises an aperture through which an ion beam passes, the aperture having a concave shaped first edge formed using a radius equal to an inner radius of the outer portion of the workpiece.

According to another embodiment, a method of implanting an outer portion of a workpiece is disclosed. The method comprises disposing the workpiece on a platen, rotatable attached to a roplat, while the platen is in a horizontal orientation, the roplat comprising a mask affixed thereto; rotating the platen from the horizontal orientation to a vertical orientation; directing an ion beam through an aperture in the mask toward the workpiece while the platen is in the vertical orientation; and rotating the platen about its center while the ion beam is directed toward the aperture, so as to implant the outer portion of the workpiece while not implanting other portions of the workpiece; wherein the mask is affixed to the roplat such that the mask does not interfere with the platen as the platen is rotated from the horizontal orientation to the vertical orientation.

BRIEF DESCRIPTION OF THE FIGURES

For a better understanding of the present disclosure, reference is made to the accompanying drawings, which are incorporated herein by reference and in which:

FIG. 1A shows a side view of an embodiment of the apparatus used for selective implanting of the outer portion of a workpiece in the load/unload position;

FIG. 1B shows a side view of the apparatus of FIG. 1A in the operational position;

FIG. 3A shows a side view of another embodiment of the apparatus used for selective implanting of the outer portion of a workpiece in the operational position;

FIG. 3B shows a side view of the apparatus of FIG. 3A in the load/unload position;

DETAILED DESCRIPTION

Figure 2A:
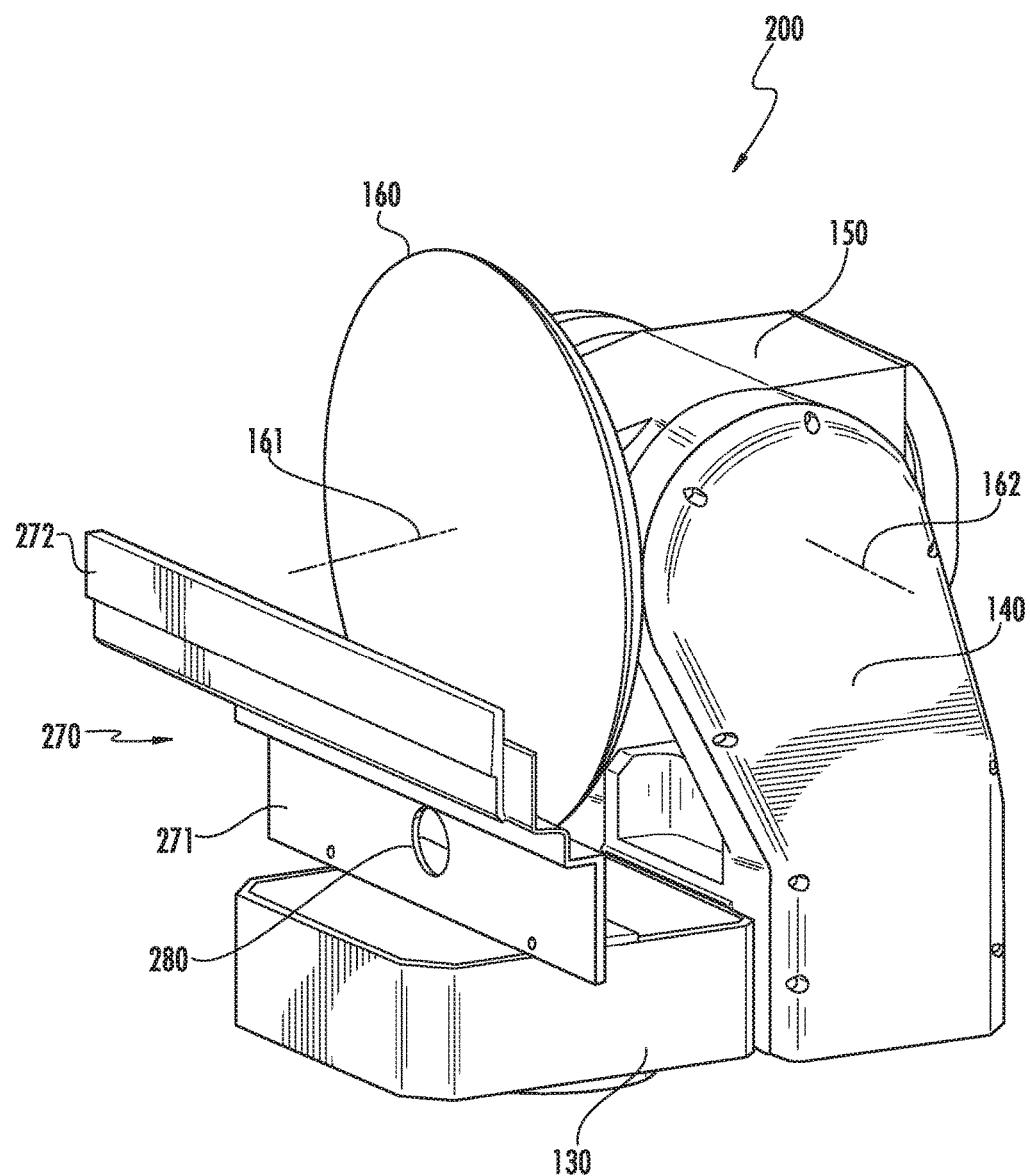
FIG. 2A shows a perspective view of another embodiment of the apparatus used for selective implanting of the outer portion of a workpiece.

As described above, semiconductor fabrication processes may have some inherent non-uniformities that may cause the outer portion of the workpiece to be processed differently than the rest of the workpiece. The present disclosure describes apparatus and methods that may be employed to selectively implant the outer portion of the workpiece to compensate for these non-uniformities. This selective processing serves to treat only the outer portion of the workpiece, while not affecting the rest of the workpiece. The outer portion of the workpiece may be an annular ring, where the outer dimension of the annular ring is defined by the diameter of the workpiece. For example, if the workpiece has a diameter of 286 mm, the annular ring may have an outer radius of 143 mm and an inner radius that is somewhat less than 143 mm. The annular ring may be tens of millimeters in width, or may be only a few millimeters. In certain embodiments, the annular ring may have a width of 3 mm. However, the width of the annular ring may vary and is not limited by this disclosure.

FIG. 1A shows an apparatus 100 for the selective processing of the outer portion of the workpiece according to one embodiment. The apparatus 100 comprises a multi-axis robot, also known as roplat 120. The roplat 120 comprises a base 130 in communication with two upward extending arms 140, which are spaced apart from one another. A rotatable assembly 150 is disposed in the space between the two upward extending arms 140 and is rotatably attached to the two upward extending arms 140. The rotatable assembly 150 includes a platen 160 that is configured to hold a workpiece (not shown). The platen 160 may be an electrostatic chuck, capable of clamping a workpiece in place through the use of electrostatic force. A first motor (not shown) may be disposed within the rotatable assembly 150 to allow the platen 160 to rotate about an axis 161, wherein axis 161 is perpendicular to the plane of the platen 160 and passes through the center of the platen 160.

A second motor (not shown) may be disposed within the roplat 120, such as within the rotatable assembly 150 or within the upward extending arms 140. The second motor allows rotation of the rotatable assembly 150 about a second axis 162. The second axis 162 may be horizontal. The rotatable assembly 150 may be capable of at least 90° of rotation. Specifically, the roplat 120 has a first position, shown in FIG. 1A, known as the load/unload position, where the rotatable assembly 150 is oriented such that the platen 160 is horizontal or substantially horizontal. While in this load/unload position, the workpiece may be placed on the platen 160, and, after processing, subsequently may be removed from the platen 160. The roplat 120 also has a second position, shown in FIG. 1B, known as the operational position, where the rotatable assembly 150 is oriented such that the platen 160 is vertical or substantially vertical. In this operational position, the platen 160 and the clamped workpiece are facing an ion beam 190 that is directed toward the platen 160. In other words, the plane formed by the surface of the platen 160 is perpendicular to the ion beam 190 when the roplat 120 is in this position.

A mask 170 is affixed to the base 130 of the roplat 120. The mask 170 may be constructed by graphite, aluminum or other suitable materials. The mask 170 has a first portion 171 that comprises an aperture 180, through which the ion beam 190 passes to implant the workpiece. This first portion 171 is disposed near the outer portion of the workpiece when the roplat 120 is in the operational position. The remainder of the mask 170 may constitute the second portion 172 of the mask 170. Since the ion beam 190 passes through the aperture 180, in certain embodiments, the first portion 171 of the mask 170 is designed such that, when in the operational position, the first portion 171 is in close proximity to the platen 160. For example, the first portion 171 of the mask 170 may be within 15 mm of the platen 160, although other distances may also be used. Further, the mask 170 is affixed to the base 130 in such a way that the platen 160 is free to rotate about the second axis 162 without contacting the mask 170. In certain embodiments, to achieve both of these objectives, the mask 170 is designed such that the first portion 171 is closer to the platen 160 than the second portion 172 of the mask 170. For example, as the platen 160 rotates about the second axis 162 from the load/unload position (see FIG. 1A) to the operational position (see FIG. 1B), the outer edge of the platen 160 moves along an arc 165. To avoid contact with the platen 160, the mask 170 is not within the volume defined by this arc 165. Thus, in the embodiment shown in FIGS. 1A-1B, the first portion 171 of the mask 170 is vertical, while the second portion of the mask 170 is outwardly curved to avoid the arc 165 of the platen 160. The second portion 172 of the mask 170 is curved such that the horizontal distance between the platen 160 and the mask 170 increases as the vertical distance from the base 130 increases.

In the operational position, shown in FIG. 1B, the ion beam 190 is directed toward the workpiece and specifically toward the aperture 180 in the mask 170. The ion beam 190 implants the workpiece only in the region that is exposed by the aperture 180. To implant the entirety of the outer portion of the workpiece, the platen 160 is rotated about the axis 161 while the ion beam 190 is being directed toward the aperture 180.

Figure 5:
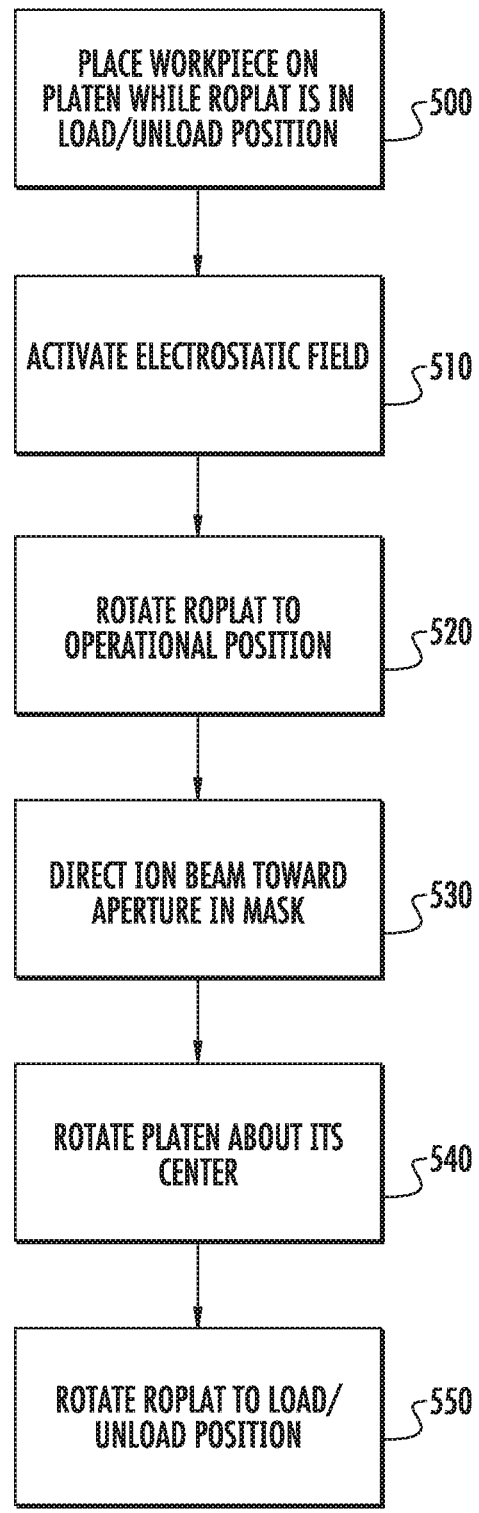
FIG. 5 is a flowchart illustrating the process of selectively implanting a workpiece using the apparatus described herein.

FIG. 5 shows a flowchart illustrating the processes used to implant the outer portion of the workpiece. First, as shown in Process 500, the workpiece is placed on the platen 160 while the roplat 120 is in the load/unload position. Once placed, an electrostatic field may be created by the platen 160, clamping the workpiece in place, as shown in Process 510. Of course, other techniques to clamp the workpiece in place may be employed. The rotatable assembly 150 is then rotated about second axis 162 to the operational position, as shown in Process 520. Once positioned, the ion beam 190 may be directed toward the aperture 180 in the mask 170 so as to begin implanting the outer portion of the workpiece, as shown in Process 530. The platen 160 is then rotated about axis 161 so that the entirety of the outer portion of the workpiece is implanted by the ion beam 190, as shown in Process 540. In certain embodiments, the platen 160 may be rotated prior to the ion beam 190 being directed toward the aperture 180. After the implant is finished, the roplat 120 may rotate back to the load/unload position, as shown in Process 550, so that the workpiece can be removed. The sequence can then be repeated for a subsequent workpiece.

The dose implanted into the outer portion of the workpiece may be controlled in a variety of ways. For example, in one embodiment, the rotational speed of the platen 160 about axis 161 is set so as to achieve the desired implant dose in a single rotation. The rotational speed may be determined based on a previously measured ion beam current. For example, a calibration process may be performed prior to executing the sequence shown in FIG. 5. In this calibration process, the ion beam current may be measured, such as by using a Faraday cup. Based on the measured ion beam current, the rotational speed of the platen 160 may be determined. As stated above, in certain embodiments, the rotational speed is determined so that the desired dose is implanted during one rotation of the platen 160. However in other embodiments, the rotational speed may be determined in conjunction with a desired number of platen rotations. For example, the platen 160 may be rotated at twice the angular speed if the workpiece is implanted during two rotations.

In certain embodiments, the platen 160 may only be able to rotate about axis 161 with a range of slightly more than 360°. In this embodiment, multiple rotations may be achieved by first rotating the platen 160 in a first direction, such as clockwise, for the first rotation. The second rotation is then performed in the opposite second direction, such as counterclockwise. This alternating pattern can be repeated for the desired number of rotations.

While FIGS. 1A-1B show a mask where a portion of the mask is curved, other embodiments are possible.

FIG. 2A shows a perspective view of a second embodiment of the apparatus 200. This embodiment is similar to the embodiment of FIGS. 1A-1B and like components are given identical reference designators and are not described again. In this embodiment, mask 270 comprises a first portion 271 where the aperture 280 is disposed. Like the embodiment of FIGS. 1A-1B, the first portion 271 is vertical in orientation. However, the second portion 272 of the mask 270 is not curved. Rather, the mask 270 has a plurality of steps arranged as a staircase shape, where the horizontal distance between the mask 270 and the platen 160 increases in a stepwise function as the vertical distance from the base 130 increases. While FIG. 2A shows the mask 270 as a series of horizontal and vertical segments, it is understood that other shapes and configurations may be used to allow the aperture to remain near the platen 160 while still allow the platen 160 to rotate between the load/unload position and the operational position. For example, the first portion of the mask may be vertical while the second portion of the mask comprises one or more slanted portions.

Figure 2C:
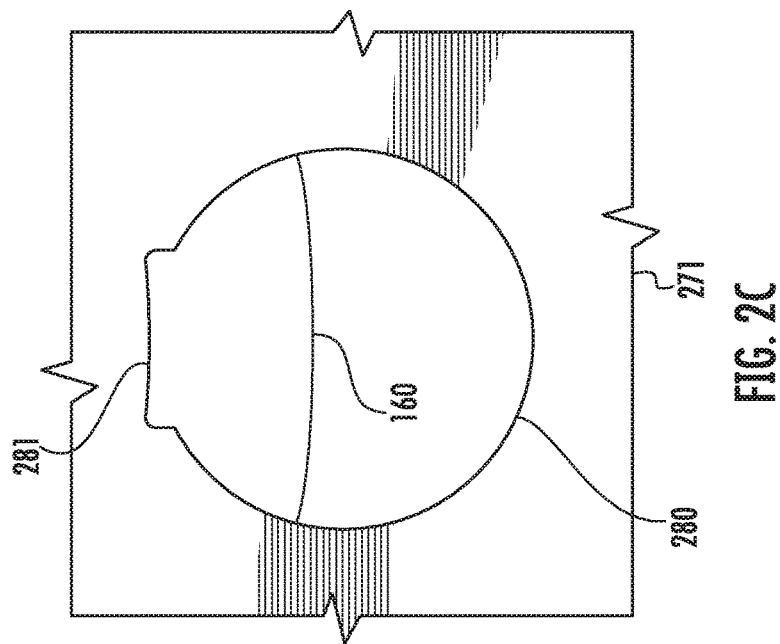
FIG. 2C shows an enlarged view of the aperture in the apparatus of FIG. 2B.
Figure 2B:
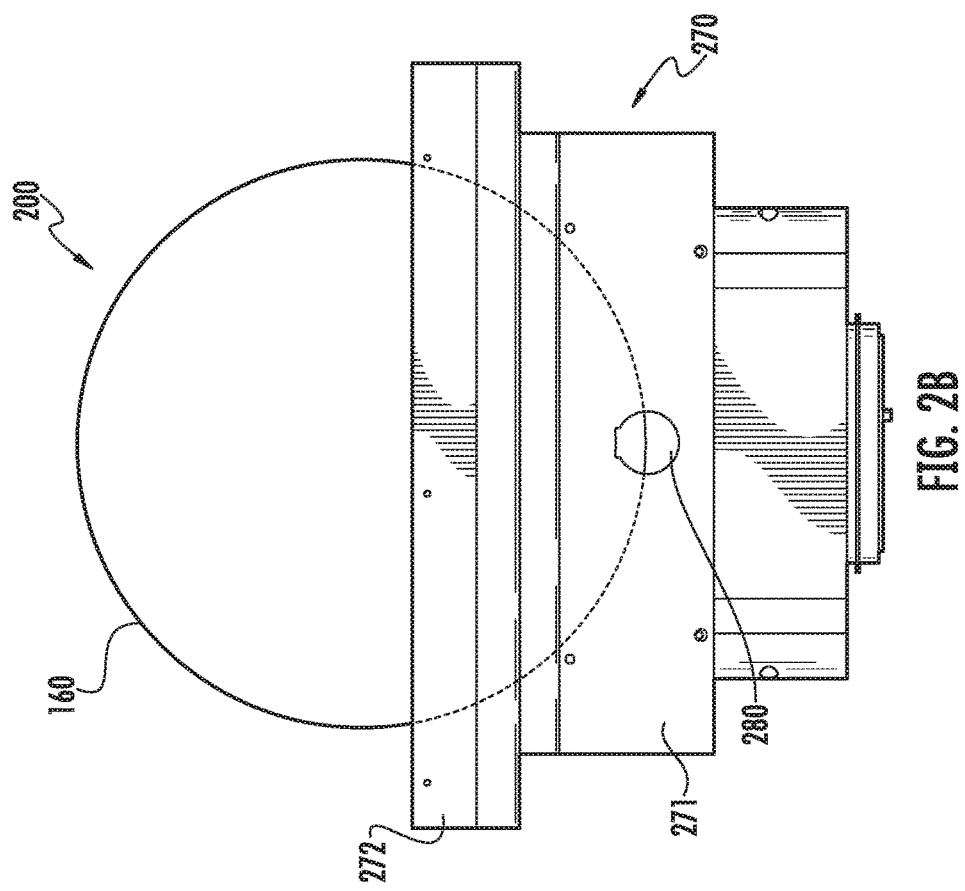
FIG. 2B shows a front view of the apparatus of FIG. 2A.

FIG. 2B shows a front view of the apparatus 200. The mask 270 serves to block a portion of the platen 160 from the ion beam. Note that the mask 270 only has to cover that portion of the platen 160 that may be exposed to the ion beam. In other words, if the ion beam is a spot beam or a ribbon beam, the mask 270 only blocks the portion of the platen 160 that would otherwise be exposed to the ion beam. In FIG. 2B, the mask 270 blocks roughly half of the platen 160 from the ion beam; however, in other embodiments, the mask 270 may block more or less of the platen 160. As noted above, the size of the mask 270 may be determined based on the size and shape of the ion beam and is not limited by this disclosure.

The aperture 280 is disposed on the first portion 271 of the mask 270, such that the ion beam strikes the outer portion of the workpiece. FIG. 2C shows an enlarged view of the aperture 280. The aperture 280 may be positioned so that a first part of the ion beam strikes the workpiece clamped on the platen 160, while a second part of the ion beam passes below the workpiece. Further, the aperture 280 may have a first edge 281, defined as the edge that is closest to the center of the platen 160. Stated differently, the first edge 281 is disposed on the side of the aperture opposite the outer edge of the platen 160. The first edge 281 may be curved in a concave manner, such that the ends of the first edge 281 are arced. In other words, the first edge 281 may be crescent shaped. In certain embodiments, the first edge 281 may be formed with a radius, where the radius of the first edge 281 is equal to the distance from the center of the platen 160 to the first edge 281. This radius may also be the same as the inner radius of the annular ring, which represents the outer portion of the workpiece to be implanted.

The remainder of the aperture may have any suitable shape. For example, FIG. 2C shows the remainder of the aperture 280 being roughly circular. However, other shapes are also possible and the disclosure is limited to any particular shape. While the aperture 280 of FIG. 2C is shown in combination with the mask 270 of FIG. 2A, it is understood that any of the embodiments described herein may be an aperture having the shape and first edge as described above.

Thus, FIGS. 1A-1B and 2A-2C show two different embodiments where the mask is affixed to the base 130 of the roplat 120. The mask extends upward from the base 130. The mask has a first portion where the aperture is disposed. In certain embodiments, the first portion of the mask is vertically oriented. The second portion of the mask is shaped so as not to be in the path of the platen 160 as the platen rotates between the load/unload position and the operational position. The second portion may be shaped in a variety of ways. For example, the second portion may be outwardly curved. In another embodiment, the second portion may comprise one or more outwardly slanted segments. In yet another embodiment, the second portion may comprise a plurality of horizontal and vertical segment forming a staircase shape.

Figure 3C:
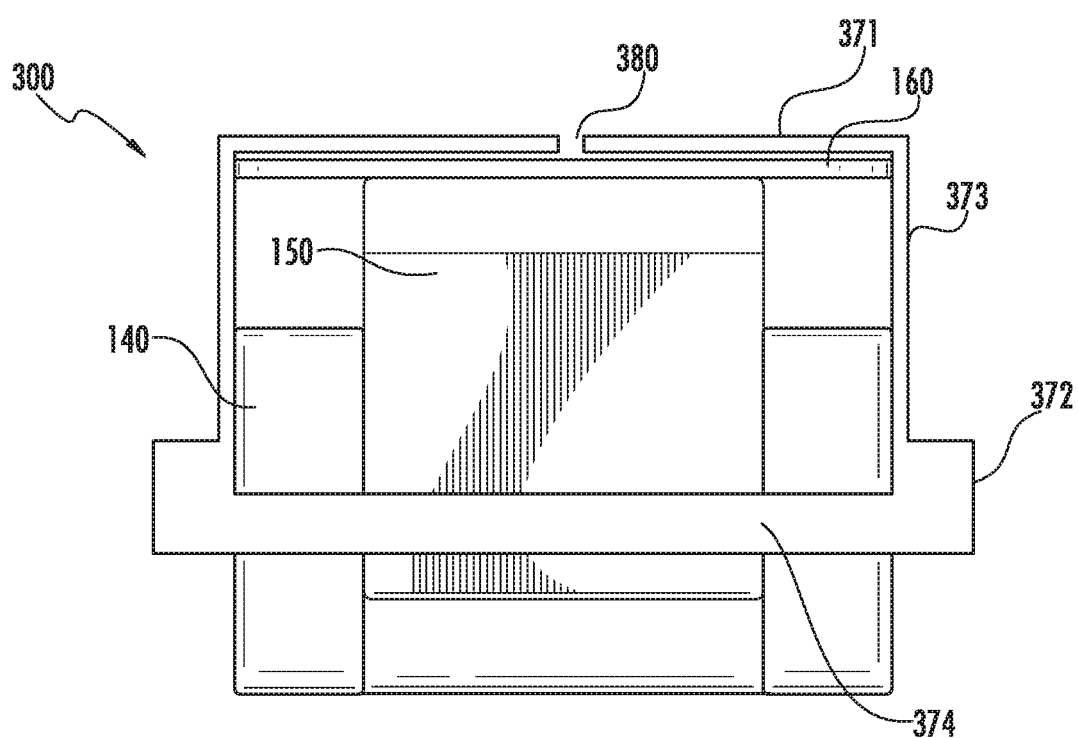
FIG. 3C shows a top view of the apparatus of FIG. 3A in the operational position.

Other embodiments of the apparatus are also possible. FIGS. 3A-3C show an embodiment of the apparatus 300 where the mask 370 is attached to the arms 140 of the roplat 120. Many of the components of this apparatus 300 is similar to those shown in FIGS. 1A-1B and therefore have been given the same reference designators. FIG. 3A shows a side view of the apparatus 300 in the operational position, where the platen 160 is vertically oriented. FIG. 3B shows a side view of the apparatus 300 in the load/unload position, where the platen 160 is horizontally oriented. FIG. 3C shows a top view of the apparatus 300 in this operational position. The extenders 372 of mask 370 extend upward from the arms 140. A crossbar 374 (see FIG. 3C) may connect the two extenders 372 at their distal ends. The proximate ends of the extenders 372 attach to the arms 140. The proximate ends of the cross members 373 attach to the distal ends of the extenders 372, such as perpendicularly. The first portion 371 of the mask 370 extends downward from the distal ends of the cross members 373. The aperture 380 is disposed in the first portion 371. Unlike the previous embodiments, the mask 370 does not include a second portion that curves outward. This is because the mask 370 does not interfere with the arc 365 formed by the rotation of the platen 160 because the mask 370 is suspended from the top of the roplat 320.

To load a workpiece, the apparatus 300 is placed in the load/unload position, as shown in FIG. 3B. The workpiece may be then moved from either the left side or the right side onto the platen 160, such that the workpiece passes between the extenders 372. The first portion 371 of the mask 370 may extend downward from the cross members 373 by an arbitrary amount; however, the first portion 371 may not extend downward beyond the plane of the platen 160 when in the load/unload position.

The aperture 380 of this embodiment may also comprise a first edge, similar to that described above. However, since the mask 370 extends downward from the top of the platen 160, the first edge would be the bottom edge of the aperture 380. Note that in all embodiments, the first edge of the aperture is located closest to the center of the platen when the platen is in the operational position.

Other embodiments are also possible. For example, FIGS. 1A-1B and 2A-2C show the mask affixed to the base 130 of the roplat 120, so as to block a bottom portion of the platen 160 from the ion beam. FIGS. 3A-3C show the mask affixed and extending upward from the two arms 140 so as to block a top portion of the platen 160 from the ion beam. In each of these embodiments, the mask is shaped and configured so as not to interfere with the platen as the roplat is rotated from the load/unload position to the operational position.

Figure 4:
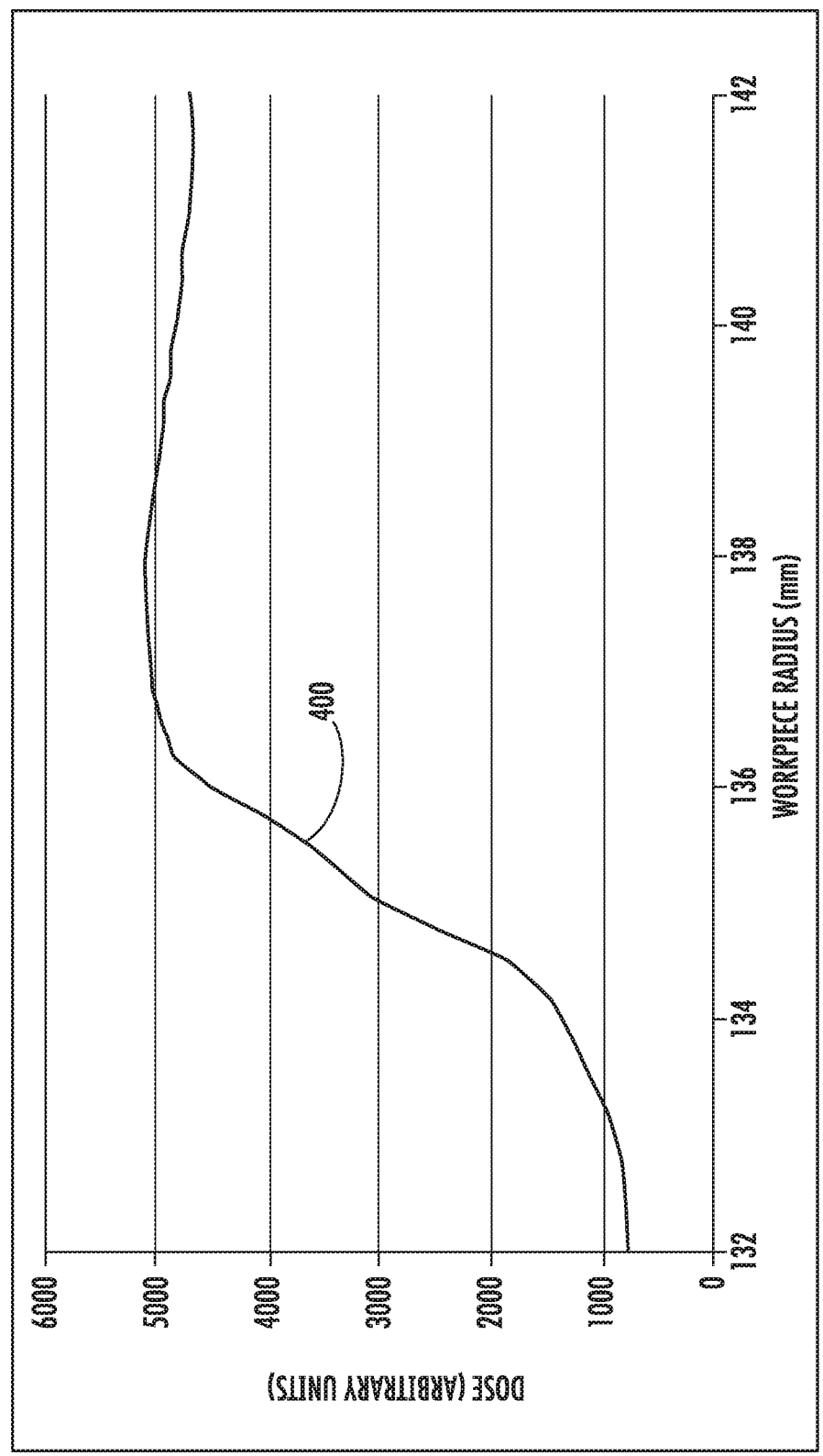
FIG. 4 shows the dose along the outer portion of a workpiece after a selective implant using the apparatus disclosed herein.

The use of a mask, such as any of those disclosed herein, allows the creation of an implanted region along the outer portion of the workpiece. FIG. 4 shows a graph that represents the dose implanted into the workpiece as a function of the radius of the workpiece. Line 400 shows the effect of the mask on the implant dose. In this test, the mask was disposed in front of the workpiece such that the first edge of the aperture was at a radius of 135 mm. The graph shows a sharp and abrupt increase in the implant dose near this radius. This is due to the shape of the first edge and the proximity of the aperture to the workpiece during implanting.

The embodiments described above in the present application may have many advantages. Affixing the mask to the roplat, either at the base or the arms, has several benefits. First, the mask is permanently aligned to the platen since the mask does not move relative to the roplat. Additionally, by affixing the mask in a way that does not interfere with the rotations of the platen, the throughput can be increased. For example, the sequence illustrated in FIG. 5 is executed repeatedly for multiple workpieces without having to move or align the mask between implants. Further, since the mask is not moved, there may be fewer particles. Additionally, the first edge is shaped to correspond to the inner radius of the outer portion of the workpiece. This allows a more abrupt transition between the implanted outer region and the rest of the workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. An apparatus for processing an outer portion of a workpiece, comprising:
   a roplat comprising:
      a base;
      arms extending upward from the base; and
      a rotatable assembly disposed between the arms, wherein the rotatable assembly rotates about an axis between a load/unload position and an operational position;
   a platen disposed on the rotatable assembly configured to rotate about its center; and
   a mask affixed to the roplat, the mask having an aperture through which an ion beam passes, wherein the mask is shaped such that the mask does not interfere with the platen as the rotatable assembly is rotated between the load/unload position and the operational position.

2. The apparatus of claim 1, wherein the aperture has a concave first edge, wherein the concave first edge is formed using a radius equal to an inner radius of the outer portion of the workpiece.

3. The apparatus of claim 1, wherein the mask is affixed to the base and blocks a bottom portion of the platen from an ion beam when the rotatable assembly is in the operational position.

4. The apparatus of claim 3, wherein the mask comprises a first portion comprising the aperture and a second portion, wherein the second portion is shaped so as not to interfere with movement of the platen.

5. The apparatus of claim 4, wherein the first portion extends vertically upward from the base.

6. The apparatus of claim 4, wherein the second portion is curved outward such that a horizontal distance between the mask and the platen increases as a vertical distance from the base increases.

7. The apparatus of claim 4, wherein the second portion comprises one or more slanted segments configured such that a horizontal distance between the mask and the platen increases as a vertical distance from the base increases.

8. The apparatus of claim 4, wherein the second portion comprises one or more horizontal segments and one or more vertical segments, configured such that a horizontal distance between the mask and the platen increases stepwise as a vertical distance from the base increases.

9. The apparatus of claim 1, wherein the mask is affixed to the arms and blocks a top portion of the platen from an ion beam when the rotatable assembly is in the operational position.

10. The apparatus of claim 9, wherein the mask comprises:
    extenders extending upward from the arms;
    cross members extending perpendicularly from the extenders; and
    a first portion extending downward from the cross members so as to block a top portion of the platen from the ion beam when the rotatable assembly is in the operational position.

11. An apparatus for processing an outer portion of a workpiece, comprising:
    a roplat comprising:
       a base;
       arms extending upward from the base; and a rotatable assembly disposed between the arms, wherein the rotatable assembly rotates about an axis between a load/unload position and an operational position;

a platen disposed on the rotatable assembly configured to rotate about its center; and a mask affixed to the roplat, and extending so as to block a portion of the platen from an ion beam when the rotatable assembly is in the operational position, wherein the mask comprises an aperture through which an ion beam passes, the aperture having a concave shaped first edge formed using a radius equal to an inner radius of the outer portion of the workpiece.

12. The apparatus of claim 11, wherein the mask is affixed to the base and blocks a bottom portion of the platen from an ion beam when the rotatable assembly is in the operational position.

13. The apparatus of claim 12, wherein the mask comprises a first portion comprising the aperture and a second portion, wherein the second portion is shaped so as not to interfere with movement of the platen.

14. The apparatus of claim 13, wherein the first portion extends vertically upward from the base.

15. The apparatus of claim 13, wherein the second portion is curved outward such that a horizontal distance between the mask and the platen increases as a vertical distance from the base increases.

16. The apparatus of claim 13, wherein the second portion comprises one or more slanted segments configured such that a horizontal distance between the mask and the platen increases as a vertical distance from the base increases.

17. The apparatus of claim 13, wherein the second portion comprises one or more horizontal segments and one or more vertical segments, configured such that a horizontal distance between the mask and the platen increases stepwise as a vertical distance from the base increases.

18. A method of implanting an outer portion of a workpiece, comprising:

disposing the workpiece on a platen, rotatable attached to a roplat, while the platen is in a horizontal orientation, the roplat comprising a mask affixed thereto;

rotating the platen from the horizontal orientation to a vertical orientation;

directing an ion beam through an aperture in the mask toward the workpiece while the platen is in the vertical orientation; and rotating the platen about its center while the ion beam is directed toward the aperture, so as to implant the outer portion of the workpiece while not implanting other portions of the workpiece;

wherein the mask is affixed to the roplat such that the mask does not interfere with the platen as the platen is rotated from the horizontal orientation to the vertical orientation.

19. The method of claim 18, wherein the aperture has a concave first edge formed using a radius where the radius is equal to an inner radius of the outer portion of the workpiece.

* * * * *